(12) United States Patent
Fuchimukai

(10) Patent No.: US 6,421,247 B1
(45) Date of Patent: Jul. 16, 2002

(54) CARD SLOT DOOR LOCKING MECHANISM

(75) Inventor: Atsushi Fuchimukai, Tokyo (JP)

(73) Assignee: Asahi Kogaku Kogyo Kabushiki Kaisha, Tokyo (JP)

( * ) Notice: Subject to any disclaimer, the term of this patent is extended or adjusted under 35 U.S.C. 154(b) by 39 days.

(21) Appl. No.: 09/644,985

(22) Filed: Aug. 24, 2000

(30) Foreign Application Priority Data

Aug. 27, 1999 (JP) .......................................... 11-241066

(51) Int. Cl.[7] ................................................. H05K 5/00
(52) U.S. Cl. ...................... 361/759; 361/755; 361/740; 361/752; 361/796; 361/797; 361/726–727; 369/75.1; 369/77.1; 360/99.02; 360/99.06
(58) Field of Search ................................ 361/755, 759, 361/740, 752, 725–727, 796, 797, 801; 369/75.1, 77.1; 360/99.01, 99.02, 99.03, 99.06, 99.07

(56) References Cited

U.S. PATENT DOCUMENTS

| | | | |
|---|---|---|---|
| 4,785,365 A | * 11/1988 | Ohkita | ........................ 360/97 |
| 5,587,854 A | * 12/1996 | Sato et al. | ................ 360/97.01 |
| 5,701,216 A | * 12/1997 | Yamamoto et al. | ...... 360/99.02 |
| 5,815,479 A | * 9/1998 | Lee | ........................... 369/77.2 |
| 5,828,918 A | 10/1998 | Abe et al. | |

* cited by examiner

*Primary Examiner*—David Martin
*Assistant Examiner*—Thanh Y. Tran
(74) *Attorney, Agent, or Firm*—Greenblum & Bernstein, P.L.C.

(57) ABSTRACT

A card slot door locking mechanism includes a card slot into which a removable card can be inserted; a card slot door which is rotatable between a closed position and an open position, the card slot-door being biased to rotate in a direction towards the closed position; and a pair of door locking members positioned away from each other in a widthwise direction of the card slot. Each of the pair of door locking members locks the card slot door independent of each other when the pair of door locking members are in a free state. Furthermore, both of the pair of door locking members concurrently unlock the card slot door when the pair of door locking members are concurrently pushed by the removable card when the removable card is properly inserted into the card slot.

15 Claims, 10 Drawing Sheets

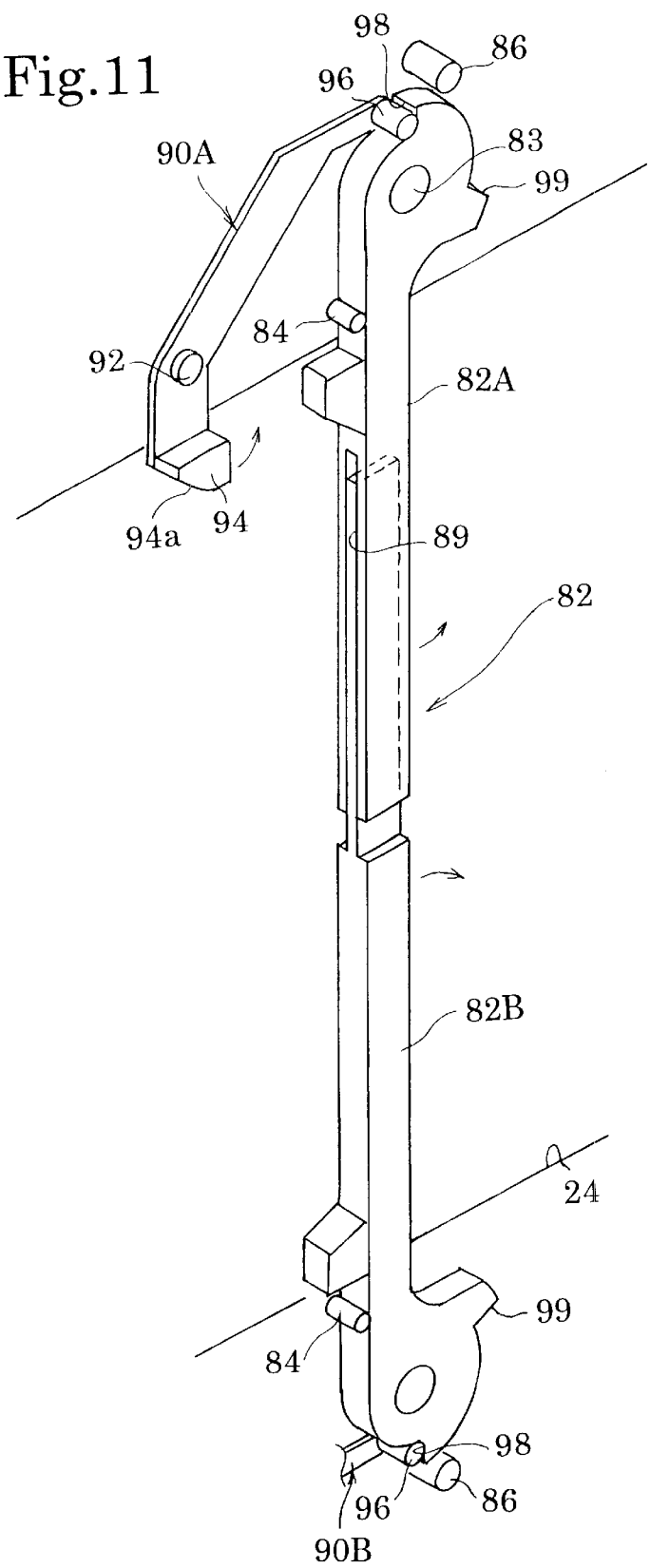

CARD SLOT DOOR LOCKING MECHANISM

BACKGROUND OF THE INVENTION

1. Field of the Invention

The present invention relates to a mechanism for locking a door of a card slot formed in an electronic device such as a digital camera. The locking mechanism unlocks the door to allow a removable card to be inserted into the card slot only when the removable card is a compatible removable card that is connectable to the electronic device.

2. Description of the Related Art

Various types of removable cards having different shape and size which are inserted into a card slot formed in an electronic device such as a digital camera (for instance, removable memory cards for digital cameras as image storing media) are available on the market. Therefore, there is the possibility that an incompatible removable card having a smaller size than a compatible removable card may be inserted into the card slot by mistake. Once such an incompatible removable card is inserted into the card slot, it is often the case that the card jams in the card slot, and in the worst cases, the card connector provided in the card slot is damaged or foreign matter is accidentally inserted into the card slot.

SUMMARY OF THE INVENTION

The primary object of the present invention is to provide a card slot door locking mechanism having a simple structure which makes it possible to prevent any incompatible removable cards or foreign matter from entering into the card slot.

To achieve the object mentioned above, according to an aspect of the present invention, a card slot door locking mechanism is provided, including a card slot into which a removable card can be inserted; a card slot door which is rotatable between a closed position, in which the card slot door shuts the card slot, and an open position, in which the card slot door opens the card slot to allow the removable card to be inserted into the card slot, the card slot door being biased to rotate in a direction towards the closed position; and a pair of door locking members positioned away from each other in a widthwise direction of the card slot. Each of the pair of door locking members locks the card slot door independent of each other when the pair of door locking members are in a free state. Both of the pair of door locking members concurrently unlock the card slot door when the pair of door locking members are concurrently pushed by the removable card when the removable card is properly inserted into the card slot.

According to the card slot door locking mechanism having such structures, since the pair of door locking members are positioned away from each other in the widthwise direction of the card slot, the removable card can be inserted into the card slot only when the pair of door locking members are concurrently pushed inward in the direction of insertion of the card into the slot, to thereby release the lock of each door locking member. Namely, even if the user tries to insert a card or a foreign matter whose width is smaller than the space between the pair of door locking members into the card slot, at least one of the door locking members remains to be locked. This prevents such an incompatible card or a foreign matter from entering into the card slot.

In an embodiment, the card slot door is formed as an elongated plate extending in the widthwise direction of the card slot, the card slot door being rotatable about a first axis extending in the widthwise direction of the card slot to be rotatable between the closed position and the open position.

In an embodiment, each of the pair of door locking members is supported on the card slot door to be rotatable about a second axis extending perpendicular to the first axis. Each of the pair of door locking members locks the card slot door by engaging an engaging portion of the each of the pair of door locking members with a corresponding stationary member which is fixedly provided within the card slot. Each of the pair of door locking members unlocks the card slot door by disengaging the engaging portion of the each of the pair of door locking members from the corresponding stationary member which is fixedly provided within the card slot.

Preferably, a biasing member is provided for each of the pair of door locking members, the biasing member biasing a corresponding one of the pair of door locking members in a direction so as to cause the engaging portion to engage with the corresponding stationary member.

In an embodiment, the biasing member is formed integral with corresponding one of the pair of door locking members. This contributes to reducing the number of elements of the card slot door locking mechanism.

In an embodiment, the card slot door is a double door having two door members positioned on the opposite sides of the card slot in the widthwise direction of the card slot, wherein each of the two door members is rotatable about an axis so as to extend substantially in the widthwise direction of the card slot when in a closed position.

In an embodiment, each of the pair of door locking members is rotatable about another axis extending parallel to the axis of the double door, wherein each of the pair of door locking members locks the card slot door by engaging an engaging portion of the each of the pair of door locking members with a corresponding one of the two door members, and each of the pair of door locking members unlocks the card slot door by disengaging the engaging portion of the each of the pair of door locking members from the corresponding one of the two door members.

Preferably, a biasing member is provided for each of the pair of door locking members, the biasing member biasing a corresponding one of the pair of door locking members in a direction so as to cause the engaging portion to engage with the corresponding one of the two door members.

Preferably, the pair of door locking members are positioned so as to be substantially symmetrical on opposite sides of a center line which extends orthogonally to the widthwise direction of the card slot and extends in a direction of insertion of the removable card, the pair of door locking members rotating in opposite rotational directions to unlock the card slot door when being concurrently pushed inward in a direction of insertion of the removable card into the card slot.

Preferably, the card slot is formed on a camera body of a digital camera, and the removable card is a memory card in which photos taken by the digital camera are stored as digital image data.

In an embodiment, the pair of door locking members are supported on the card slot door.

Preferably, each of the pair of door locking members is biased to rotate about an axis in a direction of locking the card slot door. Each of the pair of door locking members can be biased to rotate about the axis by a torsion coil spring.

In an embodiment, each of the pair of door locking members is biased to rotate about the axis by a resilient extension formed integral with the each of the pair of door locking members.

According to another aspect of the present invention, an electronic device is provided, including a card slot into which only a specific type of removable card can be inserted; a door which opens inward and closes an insertion opening of the card slot, the door being rotatable between a closed position and an open position, the door being biased to rotate in a direction towards the closed position; and a pair of door locking members positioned away from each other in a widthwise direction of the card slot, a space between the pair of door locking members being determined to correspond to a width of the specific type removable card. Each of the pair of door locking members locks the card slot door independent of respective other door locking member of the pair of door locking members when the pair of door locking members are in a free state, and both of the pair of door locking members concurrently unlock the card slot door to allow the specific type of removable card to be inserted into the card slot when the pair of door locking members are concurrently being pushed by the specific type removable card when the removable card is properly inserted into the card slot.

The present disclosure relates to subject matter contained in Japanese Patent Application No. 11-241066 (filed on Aug. 27, 1999) which is expressly incorporated herein by reference in its entirety.

BRIEF DESCRIPTION OF THE DRAWINGS

The present invention will be described below in detail with reference to the accompanying drawings in which:

FIG. 11 is a perspective view of fundamental elements of the card slot door locking mechanism shown in FIGS. 9 and 10.

DESCRIPTION OF THE PREFERRED EMBODIMENTS

FIGS. 1 through 6 show the first embodiment of a card slot door locking mechanism, provided in a digital camera, according to the present invention.

Figure 2:
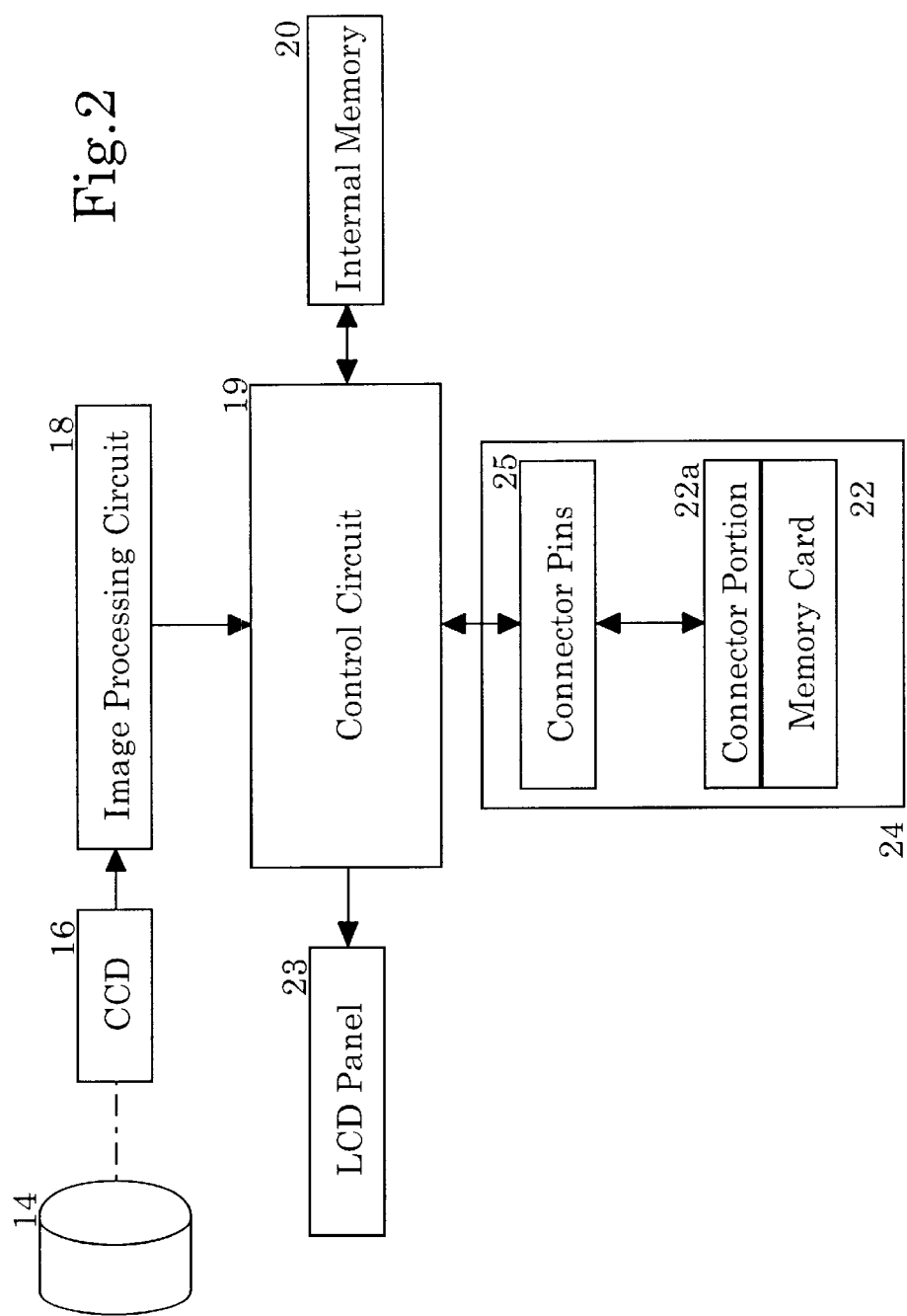
FIG. 2 is a block diagram of fundamental elements of the digital camera shown in FIG. 1.

As shown in FIG. 2, the digital camera 10 is provided with a photographic lens (photographic optical system) 14, a CCD 16, an image processing circuit 18, a control circuit 19, an internal memory 20 and an LCD panel 23. The digital camera 10 is further provided with a card slot 24 and a series of connector pins 25. The photographic lens 14 is positioned at the front of a camera body 12 of the digital camera 10. The object image is focused on the CCD 16 through the photographic lens 14. The image formed on the CCD 16 is converted into digital image data via the image processing circuit 18. The digital image data is stored in the internal memory 20 or a removable memory card (e.g., a Compact-Flash card, PCMCIA card or SmartMedia card) 22. The LCD panel 23 is fixed at the back of the camera body 12. The image formed on the CCD 16 through the photographic lens 14, the image read out of the internal memory 20, or the memory card 22 can be indicated on the LCD panel 23.

Figure 1:
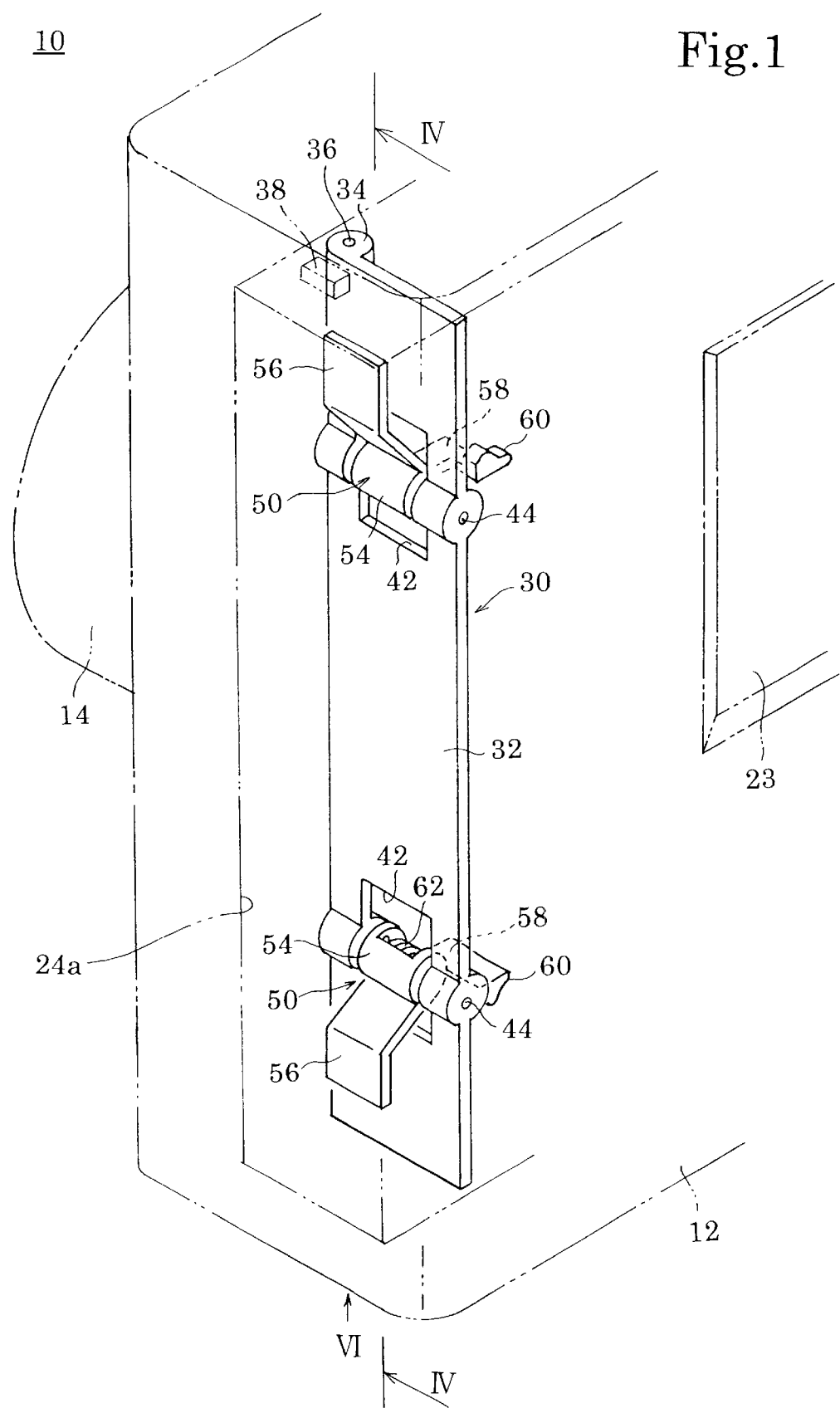
FIG. 1 is a perspective view of fundamental elements of the first embodiment of a card slot door locking mechanism, provided in a digital camera, according to the present invention, part of the digital camera being indicated by two-dot chain lines.
Figure 5:
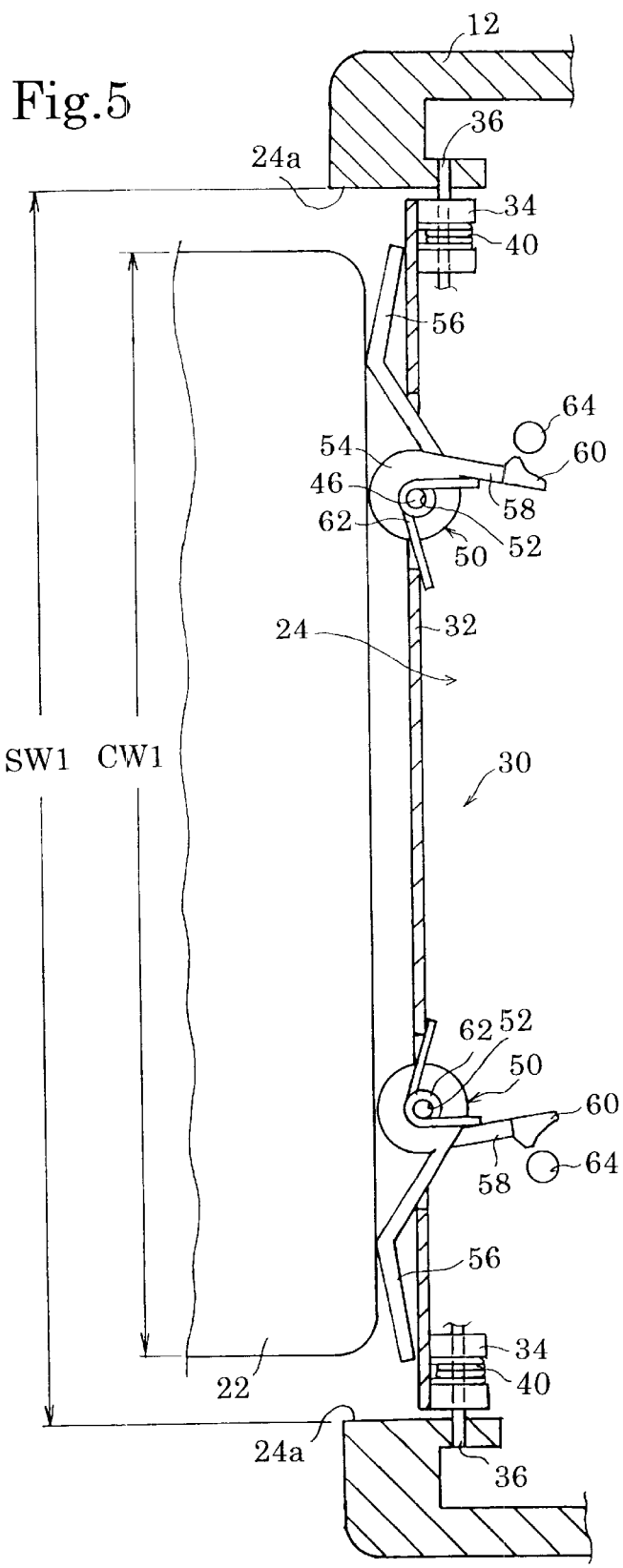
FIG. 5 is a view similar to that of FIG. 4 and illustrates the card slot door in an unlocked state thereof.
Figure 6:
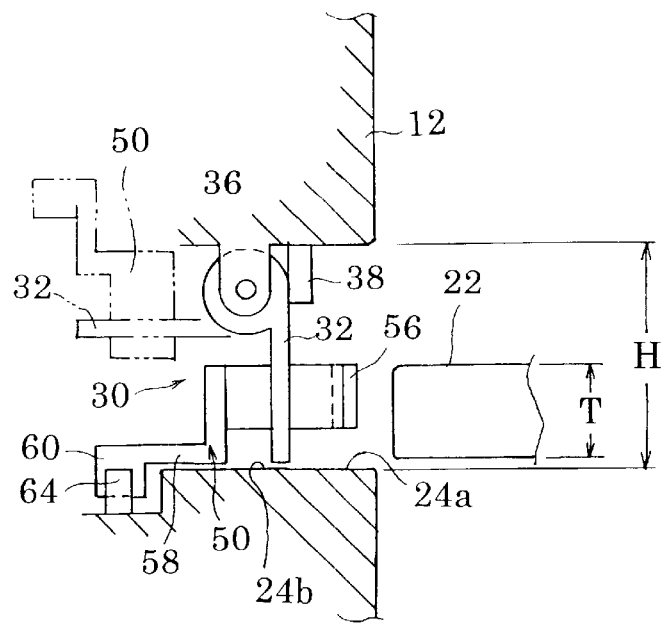
FIG. 6 is a bottom view of the card slot door locking mechanism shown in FIG. 1, looking in the direction of the arrow VI in FIG. 1, showing an open/close state of the card slot door.

The digital camera 10 is provided, on the camera body 12 on one side seen in FIG. 1 thereof, with the card slot 24. The removable memory card 22 is inserted into the card slot 24. The dimensions of the card slot 24 correspond to those of the memory card 22. Insertion opening 24a of the card slot 24 is formed on the side surface of the camera body 12. As can be seen in FIGS. 5 and 6, the width (the length in the vertical direction as viewed in FIG. 5) SW1 and height (the length in the vertical direction as viewed in FIG. 6) H of the card slot 24 are slightly greater than the width CW1 and thickness T of the memory card 22, respectively. Note that FIGS. 5 and 6 are enlarged views of the memory card 22, card slot 24 and the card slot locking mechanism. The digital camera 10 is provided at the inner end of the card slot 24 with a series of contact pins 25 which are respectively engageable with a corresponding series of receptacle contacts formed on a connector portion 22a (see FIG. 2).

The digital camera 10 is provided, in the card slot 24 in the vicinity of the insertion opening 24a thereof, with a card slot door 30. The card slot door 30 is provided with an elongated plate portion 32, which has a shape corresponding to the shape of the insertion opening 24a, and a pair of cylindrical portions 34 which are formed integral with the elongated plate portion 32 coaxially at opposite ends (upper and lower ends as viewed in FIG. 1) thereof. Each cylindrical portion 34 is provided with a bearing hole 34a which is coaxial to the bearing hole 34a of the other cylindrical portion 34. A rod 36 is inserted in the pair of bearing holes 34a. The rod 36 extends in the longitudinal direction of the card slot door 30. The opposite ends of the rod 36 are supported by the camera body 12, as shown in FIG. 5, so that the card slot door 30 can rotate about the rod 36 between a closed position (the position shown by solid lines in FIG. 6) and an open position (the position shown by chain double-dashed line (two-dot chain line) in FIG. 6). As can be seen in FIG. 6, the card slot 24 opens inward. As shown in FIGS. 1 and 6, the camera body 12 is provided within the card slot 24 with a stopper 38. The elongated plate portion 32 bumps against the stopper 38 when the elongated plate portion 32 moves to the closed position thereof, in order to prevent the elongated plate portion 32 from further rotating outward from the closed position thereof.

A torsion coil spring 40 is positioned in each cylindrical portion 34 to be fitted on the rod 36. The ends of each torsion coil spring 40 are engaged with the elongated plate portion 32 and the camera body 12, respectively, to continuously bias the card slot door 30 to rotate towards the closed position thereof.

The elongated plate portion 32 is provided with two rectangular holes 42 which are positioned away from each other in the longitudinal direction of the elongated plate portion 32. Each rectangular hole 42 is formed on the elongated plate portion 32 as a through hole that is elongated in the longitudinal direction of the elongated plate portion 32. The elongated plate portion 32 is provided on the opposite sides (right and left sides as viewed in FIG. 3) of each rectangular hole 42 with a pair of bearing holes 44, respectively, that extend coaxially in a direction perpendicular to the longitudinal direction of the elongated plate portion 32 and extend parallel to the center line L.

The card slot door 30 is provided with two locking members (door locking members) 50 corresponding to each rectangular hole 42. Each locking member 50 is disposed at a corresponding rectangular hole 42 therethrough and is supported by the elongated plate portion 32 via a corresponding rod 46 inserted through a corresponding pair of bearing holes 44. The two locking members 50 are positioned symmetrically on opposite sides of the center line L (see FIG. 3) which extends orthogonal to the longitudinal direction of the rod 36 across the center of the elongated plate portion 32. The two locking members 50 have the same structure.

Figure 3:
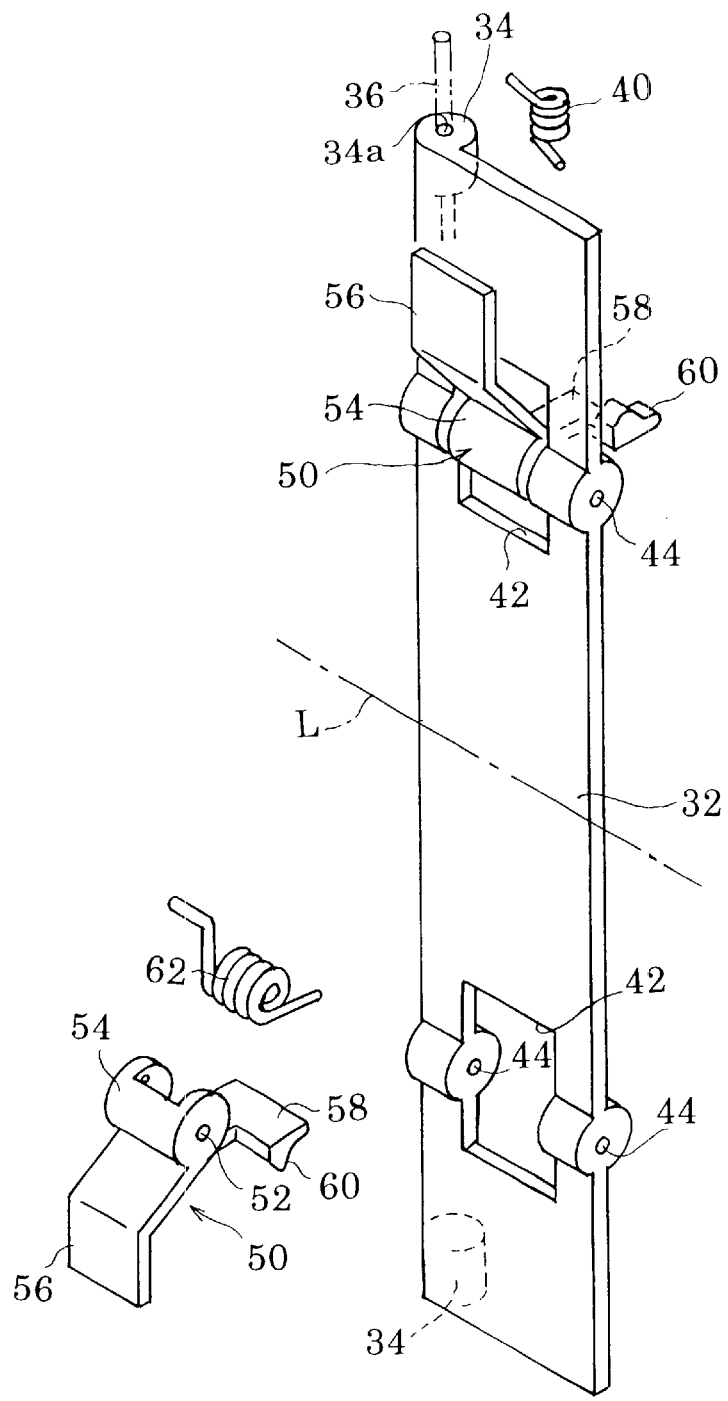
FIG. 3 is an exploded perspective view of the first embodiment of the card slot door locking mechanism shown in FIG. 1.

As can be clearly seen in FIG. 3, each locking member 50 is provided with a rod insertion hole 52 which extends coaxially to the corresponding pair of bearing holes 44 with the locking member 50 being fixed to the elongated plate portion 32 at the corresponding rectangular hole 42. A rod 46 is inserted in each pair of bearing holes 44 and the corresponding rod insertion hole 52, so that each locking member 50 is supported by the elongated plate portion 32 via a corresponding rod 46 to be rotatable about the corresponding rod 46 relative to the elongated plate portion 32.

Each locking member 50 is provided with a cylindrical portion 54, an engaging arm 56 and a locking arm 58. The engaging arm 56 and the locking arm 58 extend from the cylindrical portion 54 in different radial directions. Each locking member 50 is supported by the elongated plate portion 32 via a corresponding rod 46 so that the engaging arm 56 extends from the corresponding cylindrical portion 54 to be positioned on the front surface side of the elongated plate portion 32, and that the locking arm 58 extends from the corresponding cylindrical portion 54 to be positioned on the rear surface side of the elongated plate portion 32. The engaging arm 56 of each locking member 50 is bent at an approximate center of the engaging arm 56 by a predetermined angle (smaller than 90 degrees) towards the front surface of the elongated plate portion 32 (see FIGS. 4 and 5). On the other hand, the locking arm 58 of each locking member 50 is bent by substantially 90 degrees rearwardly in the widthwise direction of the elongated plate portion 32, and is provided at the tip thereof with an engaging bit (engaging portion) 60. The surface of the elongated plate portion 32 (the surface facing left as viewed in FIG. 4) which faces towards the outside of the camera body 12 with the elongated plate portion 32 being positioned at the closed position thereof is herein defined as the front surface of the elongated plate portion 32, and the opposite surface of the elongated plate portion 32 (the surface facing right as viewed in FIG. 4) is herein defined as the rear surface of the elongated plate portion 32.

The two locking members 50 are positioned on the elongated plate portion 32 so that the space between the two engaging arms 56 corresponds to the width CW1 of the memory card 22. Namely, the two locking members 50 are positioned on the elongated plate portion 32 so that the two locking members 50 are engaged with and pressed by the insertion end of the memory card 22 concurrently, as shown in FIG. 6, only when the memory card 22, whose dimensions correspond to those of the card slot 24, is properly inserted into the card memory slot 24.

A torsion coil spring (biasing member) 62 is positioned in the cylindrical portion 54 of each locking member 50 to be fitted on the rod 46. The ends of each torsion coil spring 62 are engaged with the corresponding locking member 50 and the elongated plate portion 32, respectively, so that each torsion coil spring 62 biases the corresponding locking member 50 to rotate about the corresponding rod 46 in a direction so as to cause the tip of the engaging arm 56 to move away from the elongated plate portion 32. Namely, the upper and lower locking members 50 are biased to rotate counterclockwise and clockwise, respectively, as viewed in FIG. 4 or 5.

Figure 4:
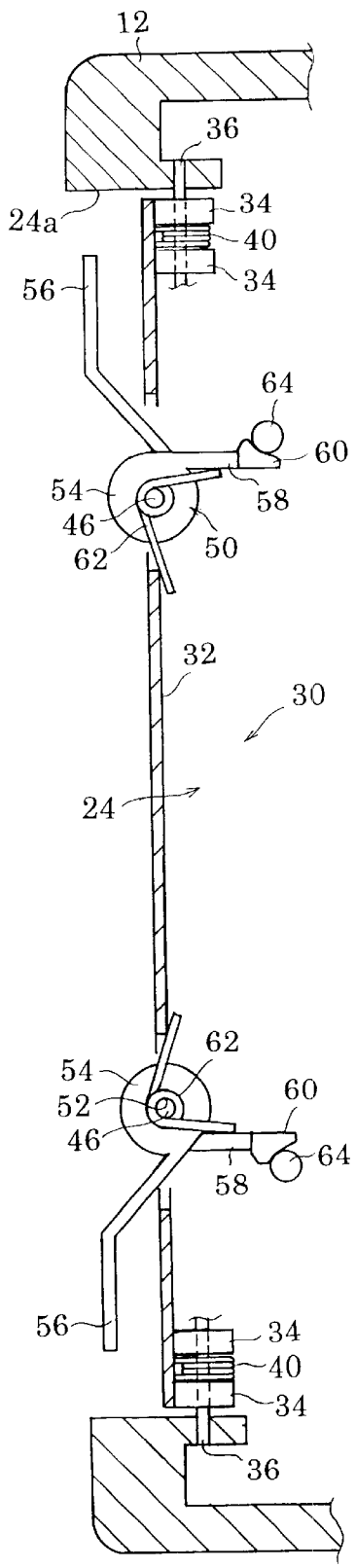
FIG. 4 is a longitudinal cross sectional view, with a card slot door in a locked state thereof, of the digital camera shown in FIG. 1, taken along IV—IV line in FIG. 1, looking in the direction of the appended arrows.

The camera body 12 is provided within the card slot 24 in the vicinity of the two locking members 50 with two fixed projections (stationary members) 64, respectively. The engaging bit 60 of each locking member 50 is engaged with the corresponding fixed projection 64 when each engaging arm 56 is in a free state. As shown in FIG. 6, each fixed projection 64 is in the shape of a cylinder which extends substantially in a direction perpendicular to the direction of insertion of the memory card 22, i.e., in the vertical direction as viewed in FIG. 6. Each fixed projection 64 is recessed from an inner side surface 24b of the card slot 24 so as not to interfere with the memory card 22 inserted in the card slot 24. The locking arm 58 of each locking member 50 is bent by substantially 90 degrees rearwardly in the widthwise direction of the elongated plate portion 32 as, previously mentioned, so that the engaging bit 60 of each locking arm 58 can be engaged with the corresponding fixed projection 64, which is recessed from the inner side surface 24b of the card slot 24. In a state as shown in FIG. 4 where each engaging bit 60 is engaged with the corresponding fixed projection 64, each locking member 50 is prevented from moving in the direction towards the inside of the card slot 24 by the engagement of each engaging bit 60 with the corresponding fixed projection 64. Therefore, in this state, the card slot door 30 cannot be opened inward if the elongated plate portion 32 is only pushed inward.

As shown in FIGS. 4 and 6, the card slot door 30 is recessed from the insertion opening 24a of the card slot 24 so that the engaging arm 56 of each locking member 50 does not project outward from the insertion opening 24a of the card slot 24.

The operation of the first embodiment of the card slot door locking mechanism will be hereinafter discussed in detail. In a free state where the memory card 22 is not inserted in the card slot 24, the card slot door 30 is in a state shown in FIG. 4. In the state shown in FIG. 4, the card slot door 30 is held in the closed position thereof by the spring force of the torsion coil springs 40 with the elongated plate portion 32 being pressed against the stopper 38, while each of the two locking members 50 is held in a position (i.e., lock position) at which the engaging bit 60 thereof is in pressing contact with the corresponding fixed projection 64 by the spring force of the corresponding torsion coil spring 62. In this state, the card slot door 30 cannot be opened inward if the elongated plate portion 32 is only pushed inward without pushing the two locking members 50 concurrently, because each locking member 50 is prevented from moving in the direction towards the inside of the card slot 24 by the engagement of each engaging bit 60 with the corresponding fixed projection 64. Furthermore, even if one of the two locking members 50 is pushed inward in the direction of insertion of the memory card 22 to disengage the engaging bit 60 of the one locking member 50 from the corresponding fixed projection 64, the engaging bit 60 of the other locking member 50 remains engaged with the corresponding fixed projection 64, so that the card slot door 30 cannot be opened inward in this case either.

Accordingly, if the user tries to insert a card or foreign matter whose width is smaller than the space between the two engaging arms 56 into the card slot 24, the two engaging arms 56 are not pushed inward concurrently, so that the card slot door 30 cannot be opened because at least one of the two engaging bits 60 remains engaged with the corresponding fixed projection 64. Conversely, if he or she tries to insert a memory card or the like whose width is greater than the width SW1 of the card slot 24 into the card slot 24, such a memory card cannot be inserted into the card slot 24 because the memory card interferes with the camera body 12 around the insertion opening 24a of the card slot 24.

FIG. 5 shows a state where the memory card 22, which has compatible dimensions with the digital camera 10, is about to be inserted into the card slot 24. The width CW1 of the memory card 22 is such that the memory card 22 can be inserted into the card slot 24 without interfering with the camera body 12, and also can push both of the pair of engaging arms 56 concurrently. Hence, if the memory card 22 is properly inserted into the card slot 24, each of the pair of locking members 50 rotates in an unlocking direction (i.e., in a direction so as to bring the tip of the engaging arm 56 close to the elongated plate portion 32) against the spring force of the corresponding torsion coil spring 62, so that the engaging bit 60 of each locking member 50 is disengaged from the corresponding fixed projection 64 as shown in FIG. 5. As can be clearly understood from FIG. 5, the unlocking rotational direction of one of the locking members 50 is opposite to the unlocking rotational direction of the other locking member 50.

If the memory card 22 is further inserted into the card slot 24 from the state shown in FIG. 5, the unlocked card slot door 30 rotates about the rod 36 to open inward against the spring force of the torsion coil springs 40 from the closed position (the position shown by solid line in FIG. 6) to the open position (the position shown by chain double-dashed line in FIG. 6) to allow the memory card 22 to be accommodated in the card slot 24. When the memory card 22 is fully inserted into the card slot 24, the series of receptacle contacts of the connector portion 22a of the memory card 22 are respectively connected with the corresponding series of contact pins 25, which are provided at the inner end of the card slot 24. In this state, the card slot door 30 is kept open inward by the inserted memory card 22, while each of the two locking members 50 is held in an unlocked position thereof.

When the memory card 22 is removed from the card slot 24, the engaging arm 56 of each locking member 50 comes into sliding contact with the memory card 22 by the spring force of both the torsion coil springs 62 and the torsion coil springs 40. Once the memory card 22 is completely removed from the card slot 24, each of the two locking members 50 returns to the lock position thereof while the card slot door 30 returns to the closed position thereof as shown in FIG. 4.

As can be understood from the above, according to the first embodiment of the card slot door locking mechanism, even if the user tries to insert a card or foreign matter whose width is smaller than the width of the memory card 22 into the card slot 24, the card slot door 30 cannot be opened. This prevents an incompatible card or foreign matter from being inserted into the card slot 24. Moreover, the card slot door 30 cannot be opened if the user tries to insert the memory card 22 into the card slot 24 with the insertion end of the memory card 22 being inclined relative to the front face of the closed card slot door 30 because the insertion end of the memory card 22 does not push both of the locking members 50 concurrently, to disengage each engaging bit 60 from the corresponding fixed projection 64. Furthermore, even if he or she tries to insert a memory card or the like whose width is greater than the width CW1 of the memory card 22 by more than a predetermined amount, such a memory card cannot be inserted into the card slot 24 because the memory card interferes with the camera body 12 around the insertion opening 24a of the card slot 24. Accordingly, the card slot door 30 opens to allow a memory card to be inserted into the card slot 24 only when the memory card 22 having the predetermined proper dimensions is inserted into the card slot in the proper direction, unless the user releases the lock of each locking member 50 intentionally.

Figure 8:
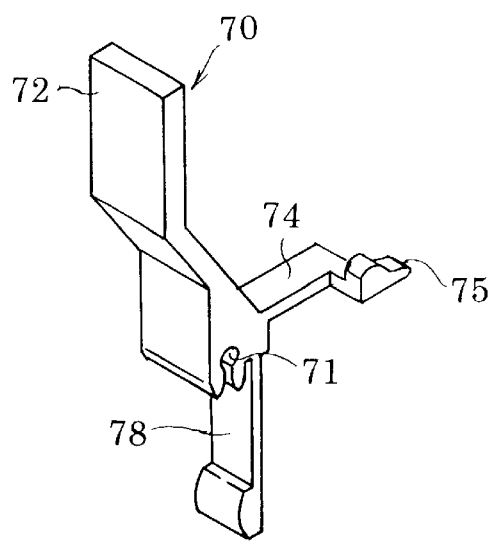
FIG. 8 is a perspective view of one of a pair of door locking members provided as elements of the second embodiment of the card slot door locking mechanism shown in FIG. 7.
Figure 7:
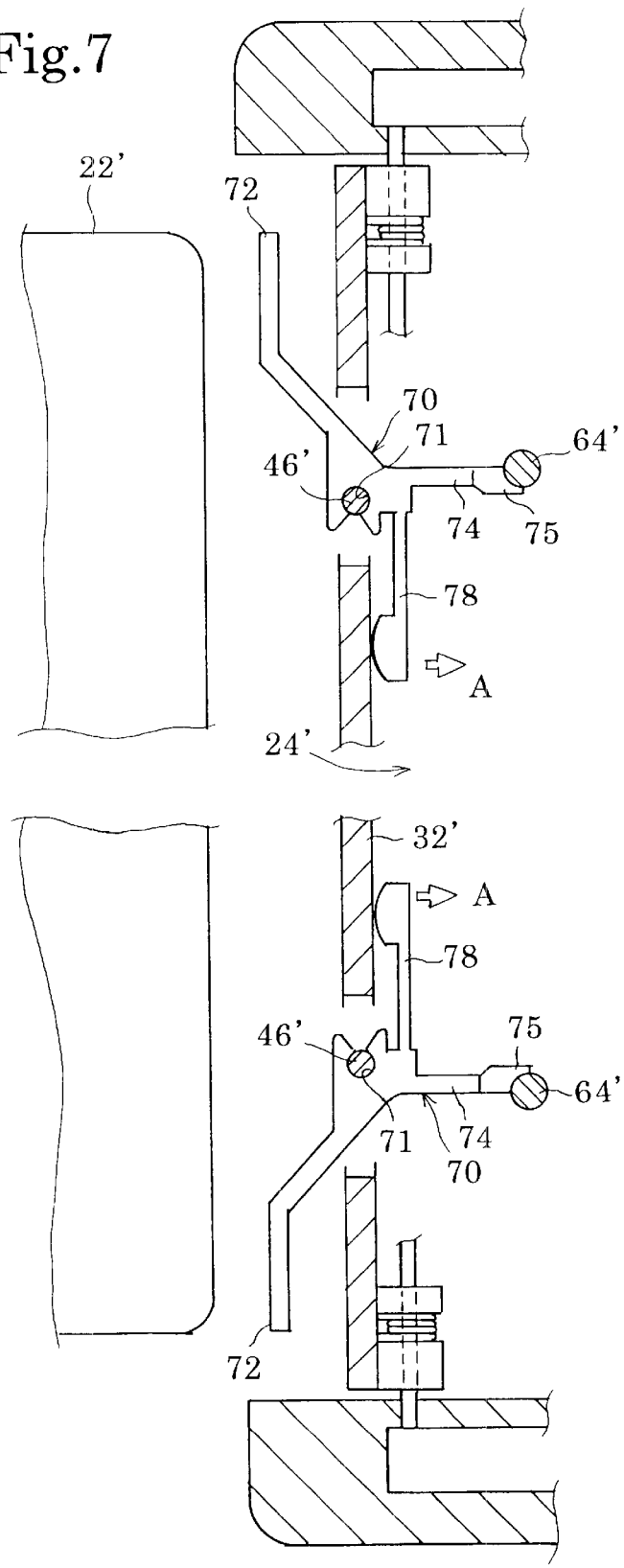
FIG. 7 is a longitudinal cross sectional view of the second embodiment of the card slot door locking mechanism, provided in a digital camera, according to the present invention.

FIGS. 7 and 8 show the second embodiment of the card slot door locking mechanism, provided in the digital camera 10, according to the present invention. The second embodiment of the card slot locking mechanism is substantially identical to the first embodiment of the card slot locking mechanism except that the card slot door 30 of the first embodiment is provided with the two locking members 50 whereas the card slot door 30 of the second embodiment is provided with corresponding two locking members (door locking members) 70 each having a different structure from the corresponding one of the two locking member 50. Similar to the locking members 50 of the first embodiment, each locking member 70 is supported by an elongated plate portion 32' (which corresponds to the elongated plate portion 32 of the first embodiment) via a corresponding rod 46' to be rotatable thereabout relative to the elongated plate portion 32'. To simplify the explanation about the structures of the locking members 70, only one of the two locking members 70 will be hereinafter discussed with reference to FIG. 8 as the two locking members 70 have the same structure except that they are formed symmetrical with respect to a line corresponding to the center line L shown in FIG. 3, similar to the two locking members 50.

The locking member 70 is provided with a rod insertion hole 71 in which a rod 46' (which corresponds to the rod 46 of the first embodiment) is inserted. Similar to the locking member 50 of the first embodiment, the locking member 70 is provided with an engaging arm 72 and a locking arm 74, which correspond to the engaging arm 56 and the locking arm 58, respectively, of the first embodiment. The engaging arm 72 and the locking arm 74 extend in different radial directions. The locking member 70 is supported by the elongated plate portion 32' via the rod 46' so that the engaging arm 72 extends towards the outside of the camera and the locking arm 74 extends towards the inside of the card slot. In accordance with rotation of the locking member 70, the engaging bit 75 (which corresponds to the engaging bit 60 of the first embodiment) of the locking member 70 is engaged with or disengaged from a corresponding fixed projection 64' (which corresponds to the fixed projection 64 of the first embodiment), similar to the locking member 50 of the first embodiment. The locking member 70 is further provided with a resilient extension 78 which extends in a direction substantially orthogonal to the locking arm 74. The resilient extension 78 is formed as like a leaf spring which can be elastically bent in a direction normal to the resilient extension 78, i.e., in the horizontal direction as viewed in FIG. 7. The engaging arm 72, the locking arm 74 and the resilient extension 78 are formed integral with the locking member 70. Each locking member 70 is made of a material which gives resilience to the resilient extension 78 (e.g., plastic).

In a state shown in FIG. 7 where each locking member 70 is properly fixed to the elongated plate portion 32' via the corresponding rod 46' with the locking arm 74 being engaged with the corresponding fixed projection 64', the tip of the resilient extension 78 of each locking member 70 is lightly pressed against the rear surface of the elongated plate portion 32', so that the resilient extension 78 of each locking member 70 is slightly bent inwardly in the direction of a corresponding arrow A shown in FIG. 7. Although the upper and lower locking members 70 as viewed in FIG. 7 are biased to rotate in the direction of the corresponding arrow A (i.e., counterclockwise and clockwise directions as viewed in FIG. 7, respectively) by the resilience of the corresponding resilient extension 78, each locking member 70 is stably held in the position shown in FIG. 7 because the engagement of the engaging bit 75 of the locking arm 74 with the corresponding fixed projection 64' prevents the locking member 70 from further rotating in the direction of the corresponding arrow A.

If a compatible memory card 22' whose width corresponds to the space between the two engaging arms 72 is properly inserted into a card slot 24' (which corresponds to the card slot 24 of the first embodiment), the two locking members 70 are engaged with, and pressed by, the insertion end of the memory card 22' concurrently, so that each of the pair of locking members 70 rotates in the direction opposite to the direction of the corresponding arrow A while the resilient extension 78 of each locking member 70 is largely bent in the direction of the corresponding arrow A shown in FIG. 7. This rotational movement of each locking member 70 disengages the engaging bit 75 of each locking member 70 from the corresponding fixed projection 64' to thereby allow the card slot door to be opened inward. If the memory card 22' is further inserted into the card slot 24', the unlocked card slot door opens.

As can be understood from the above, according to the second embodiment of the card slot door locking mechanism shown in FIGS. 7 and 8, even if the user tries to insert a card or foreign matter whose width is smaller than the width of the memory card 22' into the card slot 24', the card slot door cannot be opened because the two locking members 70 are not pushed concurrently in the direction of disengaging each engaging bit 75 from the corresponding fixed projection 64'. This prevents an incompatible card or foreign matter from entering into the card slot 24'. Moreover, the card slot door cannot be opened if the user tries to insert the memory card 22' into the card slot 24' with the insertion end of the memory card 22' being inclined relative to the front face of the closed card slot door because the insertion end of the memory card 22' does not push the two locking members 70 concurrently. Furthermore, according to the second embodiment of the card slot door locking mechanism, the resilient extension 78 is formed integral with the locking member 70, which contributes to reducing the number of elements of the card slot door locking mechanism.

In each of the first and second embodiments of the card slot door locking mechanisms, each of the two fixed projections 64 (or 64') is positioned further away from the center line L (see FIG. 3) in the longitudinal direction of the elongated plate portion 32 (or 32') with respect to the corresponding rod 46 (or 46'). Namely, the upper and lower fixed projections 64 (or 64') are positioned closer to the upper and lower ends of the card slot 24 (or 24') than the upper and lower rods 46 (or 46'), respectively. In other words, each of the two fixed projections 64 (or 64') is provided at a position away from a plane, which extends orthogonally to the corresponding rod 46 (or 46') and the elongated plate portion 32 (or 32'), in a rotational direction which is opposite to the rotational direction of the disengaging direction of the corresponding locking member 50 (or 70) with respect to the corresponding rod 46 (or 46'). This structure effectively prevents each locking member 50 (or 70) from rotating in the direction of disengaging the engaging bit 60 (or 75) thereof from the corresponding fixed projection 64 (or 64') when only the elongated plate portion 32 (or 32') is pushed inward without either locking member 50 (or 70) being pushed.

Figure 9:
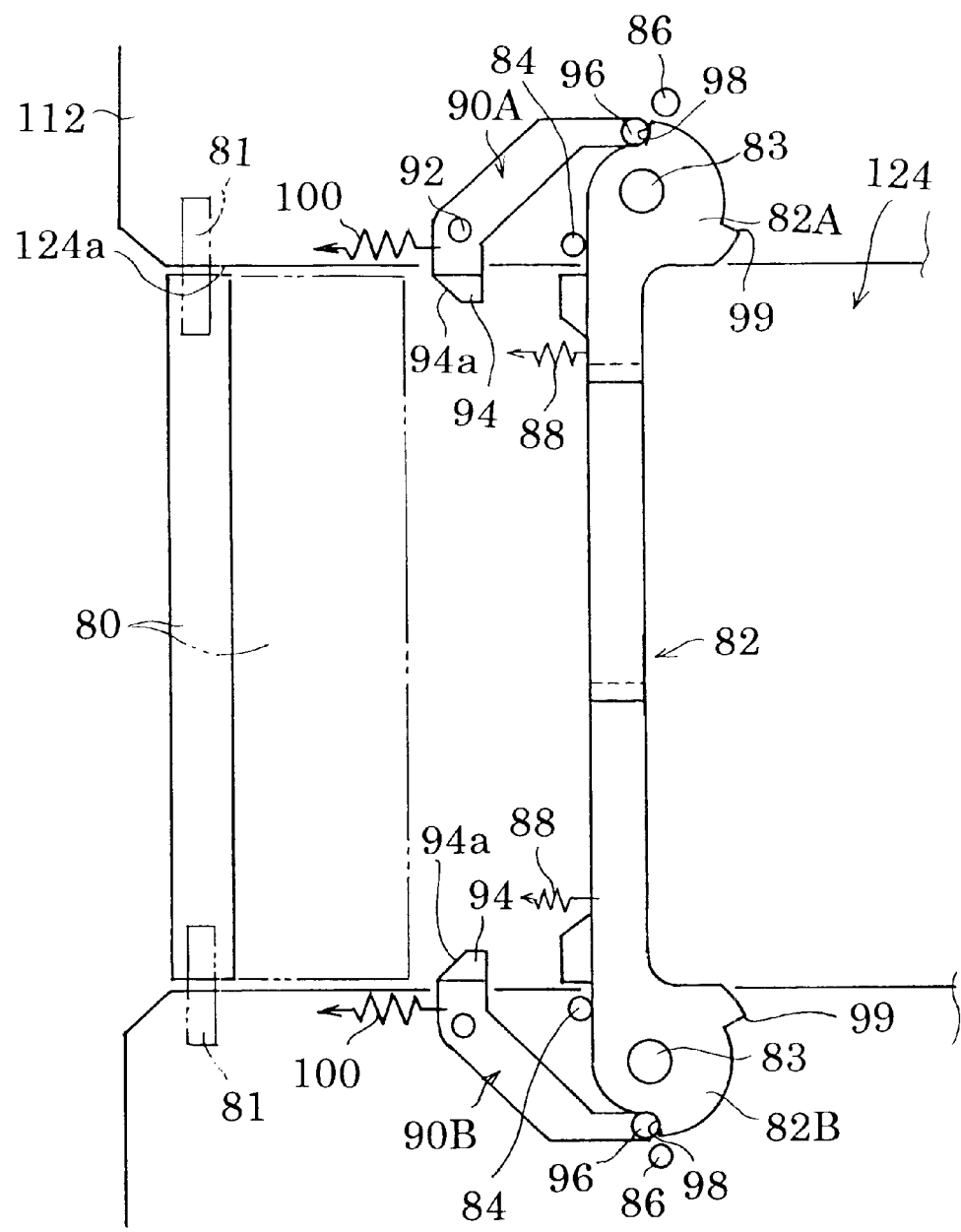
FIG. 9 is a longitudinal cross sectional view, with a card slot door in a locked state thereof, of the third embodiment of the card slot door locking mechanism, provided in a digital camera, according to the present invention.
Figure 10:
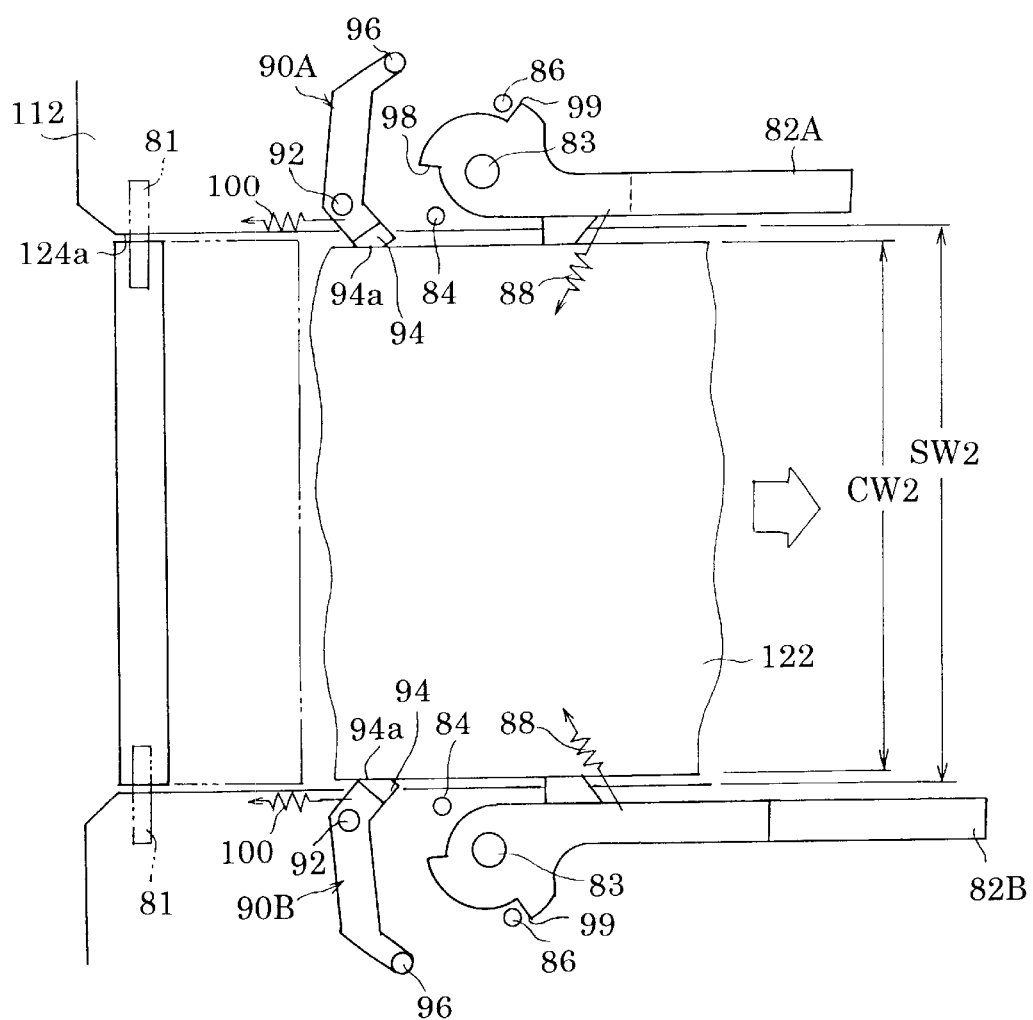
FIG. 10 is a view similar to that of FIG. 9 and illustrates a removable card inserted in the card slot.

FIGS. 9, 10 and 11 show the third embodiment of the card slot door locking mechanism, provided in the digital camera 10, according to the present invention. The longitudinal direction of a card slot 124 (which corresponds to the card slot 24 of the first embodiment) formed on a camera body 112 (which corresponds to the camera body 12 of the first embodiment) corresponds to the vertical direction of each of FIGS. 9, 10 and 11. The width SW2 of the card slot 124 is slightly greater than the width CW2 of a compatible memory card 122, respectively (see FIG. 10).

The digital camera having the third embodiment of the card slot door locking mechanism is provided in the card slot 124 with an outer card slot door 80 which is rotatable about a rods 81 extending in the vertical direction of the camera body 112 (the vertical direction as viewed in FIG. 10). The outer card slot door 80 shuts the card slot 124 when the outer card slot door 80 is in the closed position thereof shown by a solid line in each of FIGS. 9 and 10, while the outer card slot door 80 opens the card slot 124 when the outer card slot door 80 is in the open position thereof shown by a chain double-dashed line in each of FIGS. 9 and 10. The outer card slot door 80 is always biased to rotate about the rods 81 in the direction of closing the card slot 124 by a spring (not shown), and is held in the closed position by a stopper (not shown) in a free state. Note that the outer card slot door 80 is not provided with any elements of a locking mechanism corresponding to those provided on the card slot door in each of the previous embodiments.

The digital camera 10 having the third embodiment of the card slot door locking mechanism is further provided in the card slot 124 behind the outer card slot door 80 with an inner card slot door 82. The inner card slot door 82 is a double door having two narrow door plates 82A and 82B positioned on the upper and lower sides of the card slot 124. The outer end of each of the door plates 82A and 82B is rotatably fitted on a pivot 83 which extends in the direction of the height of the card slot 124 (i.e., in the direction normal to the page in FIGS. 9 and 10). In a state where the inner card slot door 82 is closed as shown in FIG. 9 or 11, the door plates 82A and 82B are substantially symmetrically arranged with respect to an imaginary center line between the upper and lower ends of the card slot 124 which extends in the direction of insertion of the memory card 122 (i.e., in the horizontal direction as viewed in FIG. 9). Each of the door plates 82A and 82B is rotatable about the corresponding pivot 83 between a closed position (the position shown in FIG. 9), in which the door plate extends in a direction substantially perpendicular to the direction of insertion of the memory card 122, and an open position (the position shown in FIG.

10), in which the door plate substantially extends in a direction parallel to the direction of insertion of the memory card 122.

The camera body 112 is provided therein with two pairs (upper and lower pairs) of projections 84 and 86. The upper pair of projections 84 and 86 are positioned in the vicinity of the pivoted end of the upper door plate 82A, while the lower pair of projections 84 and 86 are positioned in the vicinity of the pivoted end of the door plate 82B. Each of the door plates 82A and 82B is engaged with the corresponding projection 84 when positioned in the closed position as shown in FIGS. 9 and 11. The upper projection 84 prevents the upper door plate 82A from further rotating clockwise as viewed in FIG. 9 from the closed position thereof. Likewise, the lower projection 84 prevents the lower door plate 82B from further rotating counterclockwise as viewed in FIG. 9 from the closed position thereof. Each of the door plates 82A and 82B is provided in the vicinity of the pivoted end thereof with a first stepped portion 99 which is engaged with the corresponding projection 86 when the door plate is in the open position thereof (see FIG. 10). The upper projection 86 prevents the upper door plate 82A from further rotating counterclockwise as viewed in FIG. 10 from the open position thereof. Likewise, the lower projection 86 prevents the lower door plate 82B from further rotating clockwise as viewed in FIG. 10 from the open position thereof.

Each of the door plates 82A and 82B is biased to rotate towards the closed position thereof by an extension spring 88. In a state where the inner card slot door 82 is closed as shown in FIG. 9, the door plates 82A and 82B overlap each other (see FIG. 11). As shown in FIG. 11, the upper door plate 82A is provided at the free end thereof with a slit 89, while the free end of the lower door plate 82B is formed sufficiently thin so that the free end of the lower door plate 82B can enter the slot 89 of the upper door plate 82A. Accordingly, each of the door plates 82A and 82B can rotate to the closed position thereof without interfering with the other door plate, even though the lower door plate 82B is formed longer than the upper door plate 82A.

The digital camera 10 having the third embodiment of the card slot door locking mechanism is further provided in the vicinity of the pivoted ends of the door plates 82A and 82B with upper and lower locking levers 90A and 90B (door locking members), respectively. Each of the locking levers 90A and 90B is pivoted at one end thereof about a corresponding pivot 92. Each pivot 92 extends parallel to the pivots 83. The locking lever 90A and 90B are designed to correspond to the door plates 82A and 82B, respectively. To simplify the explanation about the structures of the locking lever 90A and 90B and the operation thereof, only the locking member 90A will be hereinafter discussed as the locking levers 90A and 90B have the same structure except that they are symmetrical with respect to an imaginary central line between the upper and lower ends of the card slot 124 which extends in the direction of insertion of the memory card 122 (i.e., in the horizontal direction as viewed in FIG. 9).

The lock lever 90A is bent at portion thereof pivoted about the corresponding pivot 92 so that one end of the lock lever 90A juts (protrudes) into the card slot 124. The one end (i.e., the inner end) is formed as an engaging portion 94. The other end of the lock lever 90A is provided with a cylindrical locking pin (engaging portion) 96. The lock lever 90A is bent at portion thereof between the pivoted portion and the locking pin 96 so that the locking pin 96 can be engaged with a second stepped portion 98 formed on the door plate 82A in the vicinity of the pivoted end thereof when the door plate 82A is closed.

The engaging portion 94 is provided at the tip thereof with an oblique surface 94a. When the lock lever 90A is in the rotational position shown in FIG. 9, the oblique surface 94a faces outward and is inclined with respect to the direction of insertion of the memory card 122 (i.e., is inclined with respect to the horizontal direction as viewed in FIG. 9). When the lock lever 90A is in the rotational position shown in FIG. 10, the oblique surface 94a extends substantially parallel to the direction of insertion of the memory card 122 (i.e., the horizontal direction as viewed in FIG. 9).

When the lock lever 90A is in the rotational position shown in FIG. 9, the lock pin 96 of the lock lever 90A is engaged with the second stepped portion 98 of the door plate 82A to prevent the upper door plate 82A from rotating in the opening direction thereof (i.e., counterclockwise as viewed in FIG. 9 in the case of the door plate 82A). When the lock lever 90A is in the rotational position shown in FIG. 10, the lock pin 96 of the lock lever 90A is disengaged from the second stepped portion 98 of the door plate 82A to allow the upper door plate 82A to rotate in the opening direction thereof. The lock lever 90A is biased to rotate in a direction so as to cause the lock pin 96 to engage with the door plate 82A, i.e., clockwise as viewed in FIG. 9, by an extension spring (biasing member).

The operation of the third embodiment of the card slot door locking mechanism will be hereinafter discussed in detail. In a free state where the memory card 122 is not inserted in the card slot 124, the outer and inner card slot door 80 and 82 are in a state shown in FIG. 9. In this state, if the memory card 122, whose dimensions correspond to those of the card slot 124, is inserted into the card slot 124, the insertion end of the memory card 122 pushes the outer card slot door 80 to open inward, and subsequently, the opposite corners of the insertion end of the memory card 122 come into contact with the upper and lower oblique surfaces 94a of the engaging portions 94 of the lock levers 90A and 90B concurrently. Pushing the engaging portions 94 by inserting the memory card 122 causes each of the locking levers 90A and 90B to rotate in the direction of disengaging the corresponding lock pin 96 from the corresponding second stepped portion 98 of the door plates 82A or 82B to allow the door plates to rotate in the opening direction thereof. If the memory card 122 is further inserted into the card slot 124, the insertion end of the memory card 122 contacts and pushes the inner card slot door 82 (the door plates 82A and 82B) inward to open the same. At this time, since each of the door plates 82A and 82B has been already unlocked, each of the door plates 82A and 82B is pushed by the insertion end of the memory card 122 to rotate in the opening direction against the spring force of the corresponding extension spring 88. This allows the memory card 122 to be fully inserted into the card slot 124.

Conversely, if the memory card 122 is removed out of the card slot 124, each of the door plates 82A and 82B returns to the closed position thereof shown in FIG. 9 by the spring force of the corresponding extension spring 88, while each of the lock levers 90A and 90B also returns to the lock position thereof shown in FIG. 9 by the spring force of the corresponding extension spring 100. The outer card slot door 80 also returns to the closed position thereof to shut the card slot 124.

If the user tries to insert a memory card or foreign matter whose width is smaller than the width of the compatible memory card 122 into the card slot 24, the third embodiment of the card slot door locking mechanism prevents such items from entering the card slot 124 in the following described manner. Namely, a card having a smaller width than the compatible memory card 122 cannot push the upper and lower oblique surfaces 94a of the engaging portions 94 of the lock levers 90A and 90B concurrently. In other words, such an incompatible card can push either oblique surface 94a at best. In this state, at least one of the lock levers 90A and 90B remains in the lock position thereof, so that at least one of the door plates 82A and 82B does not open even if pushed inward. This structure effectively prevents an incompatible memory card or a foreign matter from entering the card slot 124. Moreover, the card slot door 82 cannot be opened if the user tries to insert the memory card 122 into the card slot 124 with the insertion end of the memory card 122 being inclined relative to the direction of insertion of the memory card 122 (i.e., relative to the horizontal direction as viewed in FIG. 9).

As can be understood from the foregoing, according to each of the first, second and third embodiments of the card slot door locking mechanisms, since each of the pair of door locking members locks the card slot door independently of each other when in a free state, and since both of the door locking members concurrently unlock the card slot door when the pair of door locking members are concurrently pushed by the removable card when the removable card is properly inserted into the card slot, even if the user tries to insert an incompatible card or foreign matter whose width is smaller than the space between the pair of door locking members into the card slot, at least one of the door locking members remains locked. This prevents such an incompatible card or foreign matter from entering into the card slot.

The present invention is not limited solely to the particular embodiments described. For instance, the card slot door locking mechanism according to the present invention can be applied to a card slot of other appliances such as a PC card slot of a PDA (personal digital assistant) or a lap-top computer.

As can be understood from the foregoing, according to the card slot door locking mechanism to which the present invention is applied, a card slot door locking mechanism having a simple structure which makes it possible to prevent any incompatible removable cards or foreign matter from entering into the card slot can be obtained.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. A card slot door locking mechanism comprising:
   a card slot into which a removable card can be inserted;
   a card slot door which is rotatable between a closed position, in which said card slot door shuts said card slot, and an open position, in which said card slot door opens said card slot to allow said removable card to be inserted into said card slot, said card slot door being biased to rotate in a direction towards said closed position; and
   a pair of door locking members positioned away from each other in a widthwise direction of said card slot;
   wherein each of said pair of door locking members locks said card slot door independent of respective other door locking member of said pair of door locking members when said pair of door locking members are in a free state; and
   wherein both of said pair of door locking members concurrently unlock said card slot door when said pair of door locking members are concurrently pushed by said removable card when said removable card is properly inserted into said card slot.

2. The card slot door locking mechanism according to claim 1, wherein said card slot door is formed as an elongated plate extending in said widthwise direction of said card slot, said card slot door being rotatable about a first axis extending in said widthwise direction of said card slot to be rotatable between said closed position and said open position.

3. The card slot door locking mechanism according to claim 2, wherein each of said pair of door locking members is supported on said card slot door to be rotatable about a second axis extending perpendicular to said first axis,
   wherein each of said pair of door locking members locks said card slot door by engaging an engaging portion of said each of said pair of door locking members with a corresponding stationary member which is fixedly provided within said card slot, and
   wherein each of said pair of door locking members unlocks said card slot door by disengaging said engaging portion of said each of said pair of door locking members from said corresponding stationary member which is fixedly provided within said card slot.

4. The card slot door locking mechanism according to claim 3, further comprising a biasing member provided for each of said pair of door locking members, said biasing member biasing a corresponding one of said pair of door locking members in a direction so as to cause said engaging portion to engage with said corresponding stationary member.

5. The card slot door locking mechanism according to claim 4, wherein said biasing member is formed integral with corresponding one of said pair of door locking members.

6. The card slot door locking mechanism according to claim 1, wherein said card slot door comprises a double door having two door members positioned on the opposite sides of said card slot in said widthwise direction of said card slot,
   wherein each of said two door members is rotatable about an axis so as to extend substantially in said widthwise direction of said card slot when in a closed position.

7. The card slot door locking mechanism according to claim 6, wherein each of said pair of door locking members is rotatable about another axis extending parallel to said axis,
   wherein each of said pair of door locking members locks said card slot door by engaging an engaging portion of said each of said pair of door locking members with a corresponding one of said two door members, and
   wherein each of said pair of door locking members unlocks said card slot door by disengaging said engaging portion of said each of said pair of door locking members from said corresponding one of said two door members.

8. The card slot door locking mechanism according to claim 7, further comprising a biasing member provided for each of said pair of door locking members, said biasing member biasing a corresponding one of said pair of door locking members in a direction so as to cause said engaging portion to engage with said corresponding one of said two door members.

9. The card slot door locking mechanism according to claim 1, wherein said pair of door locking members are positioned so as to be substantially symmetrical on opposite sides of a center line which extends orthogonally to said widthwise direction of said card slot and extends in a direction of insertion of said removable card, said pair of door locking members rotating in opposite rotational directions to unlock said card slot door when being concurrently pushed inward in said direction of insertion of said removable card into said card slot.

10. The card slot door locking mechanism according to claim 1, wherein said card slot is formed on a camera body of a digital camera, and wherein said removable card is a memory card in which photos taken by said digital camera are stored as digital image data.

11. The card slot door locking mechanism according to claim 1, wherein said pair of door locking members are supported on said card slot door.

12. The card slot door locking mechanism according to claim 1, wherein each of said pair of door locking members is biased to rotate about an axis in a direction of locking said card slot door.

13. The card slot door locking mechanism according to claim 12, wherein each of said pair of door locking members is biased to rotate about said axis by a torsion coil spring.

14. The card slot door locking mechanism according to claim 12, wherein each of said pair of door locking members is biased to rotate about said axis by a resilient extension formed integral with said each of said pair of door locking members.

15. An electronic device comprising:

a card slot into which only a specific type of removable card can be inserted;

a door which opens inward and closes an insertion opening of said card slot, said door being rotatable between a closed position and an open position, said door being biased to rotate in a direction towards said closed position; and a pair of door locking members positioned away from each other in a widthwise direction of said card slot, a space between said pair of door locking members being determined to correspond to a width of said specific type removable card;

wherein each of said pair of door locking members locks said card slot door independent of respective other door locking member of said pair of door locking members when said pair of door locking members are in a free state, and wherein both of said pair of door locking members concurrently unlock said card slot door to allow said specific type of removable card to be inserted into said card slot when said pair of door locking members are concurrently being pushed by said specific type removable card when said specific type of removable card is properly inserted into said card slot.

* * * * *